United States Patent [19]

Dydyk

[11] Patent Number: 5,469,129
[45] Date of Patent: Nov. 21, 1995

[54] IMPEDANCE TRANSFORMING THREE-PORT POWER DIVIDER/COMBINER USING LUMPED ELEMENTS

[75] Inventor: Michael Dydyk, Scottsdale, Ariz.

[73] Assignee: Motorola, Inc., Schaumburg, Ill.

[21] Appl. No.: 297,067

[22] Filed: Aug. 29, 1994

[51] Int. Cl.⁶ .................................................. H03H 7/48
[52] U.S. Cl. ........................................... 333/124; 333/100
[58] Field of Search ................................. 333/100, 118, 333/124

[56] References Cited

U.S. PATENT DOCUMENTS

| 3,146,409 | 8/1964 | Lalmond | 333/100 X |
|---|---|---|---|
| 3,593,208 | 7/1971 | Smith | 333/112 |
| 3,701,057 | 10/1972 | Hoer | 333/112 |
| 3,723,914 | 3/1973 | Cappucci | 333/112 |
| 4,011,528 | 3/1977 | Podell et al. | 333/112 |
| 4,367,445 | 1/1983 | Dydyk | 333/127 |
| 4,482,873 | 11/1984 | Nyhus | 333/116 |
| 4,777,458 | 10/1988 | Pardini | 333/112 |
| 4,851,795 | 7/1989 | Beckwith | 333/124 X |
| 4,937,541 | 6/1990 | Podell et al. | 333/116 |
| 5,045,821 | 9/1991 | Staudinger et al. | 333/118 |
| 5,304,961 | 4/1994 | Dydyk | 333/118 X |

Primary Examiner—Paul Gensler
Attorney, Agent, or Firm—Jeffrey D. Nehr

[57] ABSTRACT

An impedance transforming three-port power divider/combiner includes first, second, and third lumped elements (e.g. 54, 55, and 56). The first lumped element (54) couples the first port (51) and electrical ground. The second lumped element (55) couples the first and second ports (51 and 52), and the third lumped element (56) couples the first and third ports (51 and 53). A resistor (59) is coupled between the second and third ports (52 and 53). Capacitors (57 and 58) couple the second port (52) and the third port (53) to electrical ground. A signal input to the first port (51) results in identical divided output signals at the second and third ports (52 and 53). Signals input to the second and third ports (52 and 53) result in a combined output signal at the first port (51).

24 Claims, 4 Drawing Sheets

IMPEDANCE TRANSFORMING THREE-PORT POWER DIVIDER/COMBINER USING LUMPED ELEMENTS

FIELD OF THE INVENTION

This invention relates in general to power dividers and combiners and in particular to an impedance transforming three-pod power divider/combiners using lumped elements.

BACKGROUND OF THE INVENTION

Figure 1:
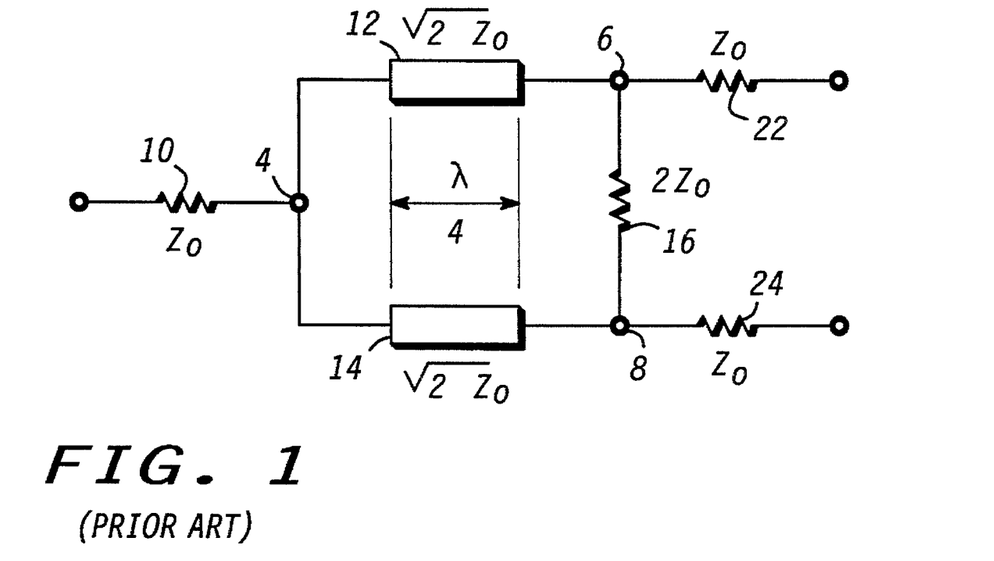
In FIG. 1 there is shown a Wilkinson power divider/combiner which is prior art.

A circuit transfer function known as the Wilkinson power divider/combiner using distributed networks is shown in FIG. 1. It is a three port device having pods 4, 6, and 8. Impedance 10, of value $Z_o$, may represent either a combining load or a source impedance. Transmission media 12 and 14 may be any sod of a transmission line such as, but not limited to, open wire line, coaxial cable, or wave guide. Each transmission medium 12 and 14 has a characteristic impedance equal to $\sqrt{2}$ times $Z_o$, as shown. The right end of each of these transmission media 12 and 14 is connected via impedance 16, of value 2 times $Z_o$. Ports 6 and 8 are connected to impedances 22 and 24, each of impedance value $Z_o$.

The divider/combiner of FIG. 1 may be considered as a divider if input port 4 is connected to a source of signal energy. As a divider, output ports 6 and 8 each produce one-half of the input power less the losses in the system. Impedance 10 represents the source impedance of the generator supplying the input power. Impedances 22 and 24 represent the load impedance of the two split loads. Each of the transmission media 12 and 14 are an odd multiple of one-quarter wavelength long at an operating frequency of interest in whatever media is provided.

If the network of FIG. 1 is used as a power combiner, impedances 22 and 24 represent the source impedances of two source power generators. Impedance 10 represents the impedance of the load.

The Wilkinson power divider/combiner of FIG. 1 is limited in that the input and output impedances are all equal to $Z_o$. The design does not facilitate the use of different input and output impedances regardless of whether it is used as a combiner or a divider. Where input and output impedances are required to be different, prior art systems have typically accomplished the required matching by adding electrical transformer elements at input and/or output ports. These transformers may take the form of odd multiples of quarter wavelengths of transmission media having a characteristic impedance determined by the required input and output impedances which must be matched. This solution tends to provide a relatively expensive and bulky network. The larger networks reduce efficiency in terms of system losses.

Figure 2:
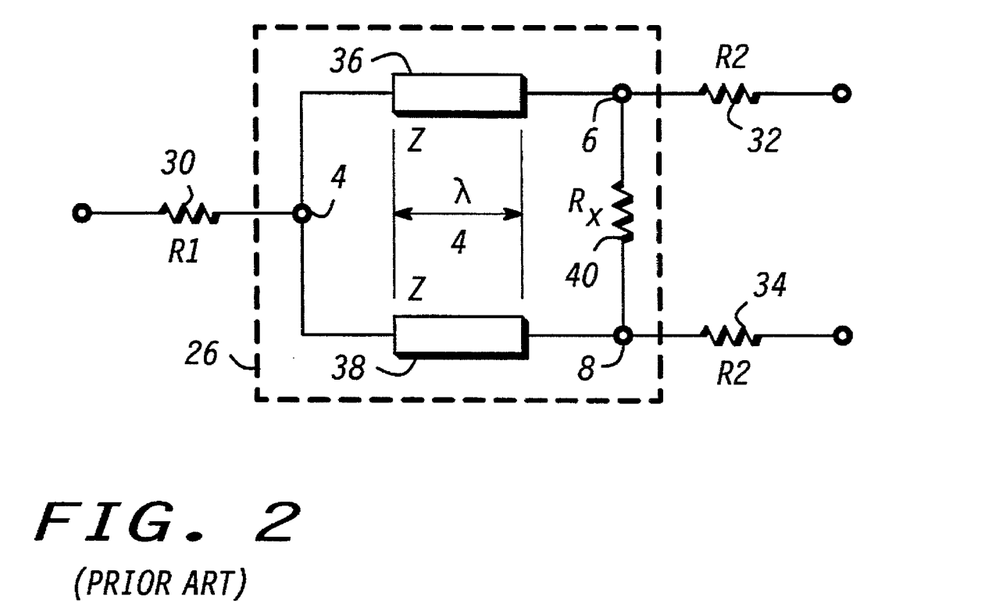
In FIG. 2, there is shown a Wilkinson power divider/combiner with impedance transformation which is prior art.

These shortcomings were overcome by Dydyk as disclosed in U.S. Pat. No. 4,367,445, entitled "Impedance Transforming Three-Pod Power Divider" herein incorporated by reference and illustrated in FIG. 2. FIG. 2 is a more generalized version of FIG. 1, where the terminating impedances 32 and 34 at ports 6 and 8 are different from the generator impedance 30 at port 4. The Wilkinson power divider/combiner of FIG. 1 was modified in FIG. 2 to perform combining/dividing and impedance transformation using distributed networks with single and double sections of the Wilkinson concept.

There is a need of the same combining/dividing and impedance transformation functions in microwave monolithic integrated circuits (MMICs). To be cost effective, these functions must be accomplished without requiring a great deal of surface area on semiconductor die. Thus, using distributed networks at low microwave frequencies is not desirable.

DETAILED DESCRIPTION OF THE DRAWINGS

While the impedance transforming three-port power divider/combiner using lumped elements discussed is particularly suited for the applications described below, other applications for the impedance transforming three-port power divider/combiner using lumped elements will be readily apparent to those of skill in the art.

The present invention can be more fully understood with reference to the figures. FIG. 1 illustrates a Wilkinson power divider/combiner which is prior art, and was described in the background of the invention.

A distributed network realization of a single section transforming impedance divider/combiner which is prior art is shown in FIG. 2. FIG. 2 includes terminating impedances 32 and 34 at ports 6 and 8 which are different from the generator impedance 30 at port 4. Note that the Zo values of the impedance of each port 4, 6, and 8 of the circuit of FIG. 1 are generalized into resistor 30 ($R_1$) and resistors 32 and 34 ($R_2$) values in FIG. 2. Port 4 and 6 as well as port 8 are connected via a quarter of a wavelength of transmission line 36 and 38 (at an operating frequency of a signal of interest). The characteristic impedance $Z=[2(R_1)(R_2)]^{0.5}$. Ports 6 and 8 are connected via a resistor 40, ($R_x$) with a value depending on terminal 6 and 8 loading and given by $R_x=2(R_2)$. To incorporate this transforming impedance combined divider within MMICs in a cost effective manner, lumped elements must be used.

Figure 3:
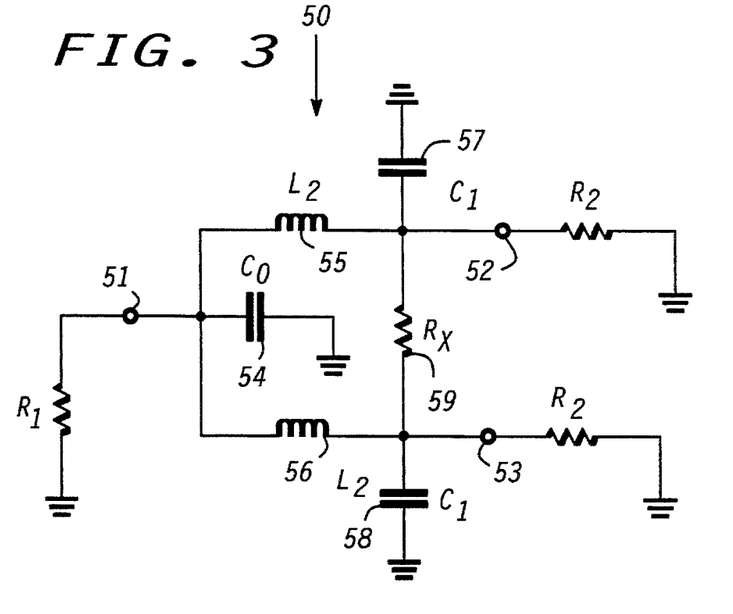
In FIG. 3, there is shown an impedance transforming three-port power divider/combiner using lumped elements in a single section in accordance with a preferred embodiment of the invention.
Figure 4:
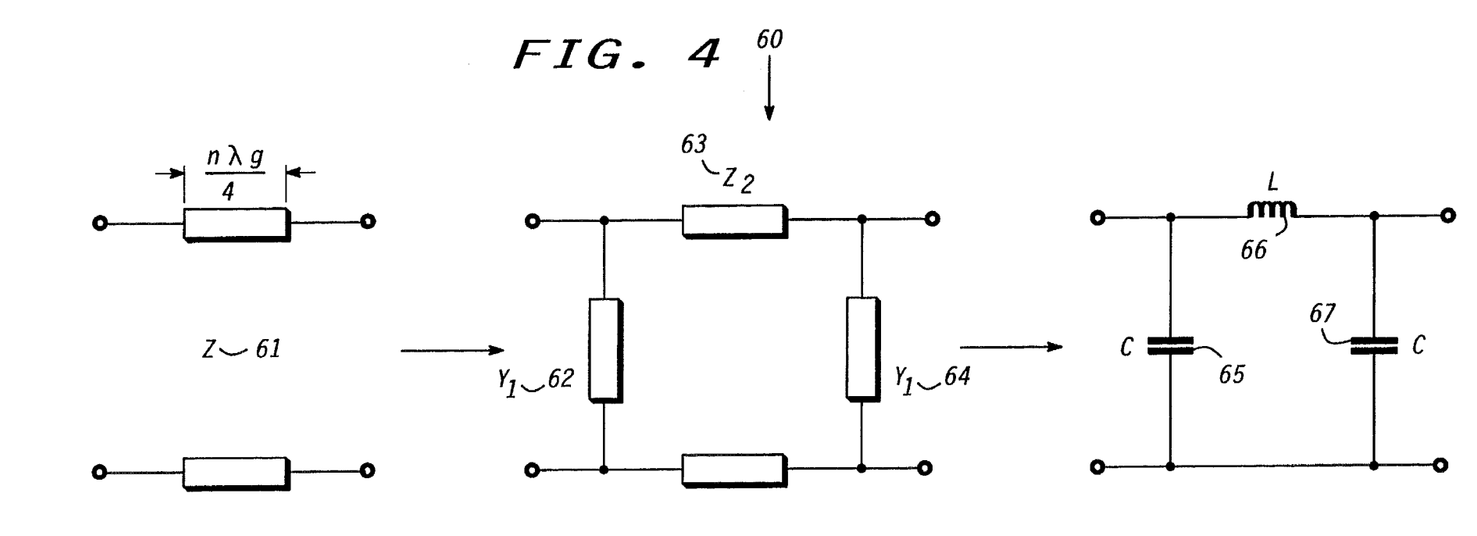
In FIG. 4, there is shown an equivalency between transmission lines and a lumped element representation of FIG. 3.

A broad band, impedance transforming three-port power divider/combiner 50 using lumped elements is shown in a first embodiment in accordance with the present invention in FIG. 3 using the equivalency between transmission line and lumped element representation in FIG. 4. In general, the FIG. 3 configuration replaces a transmission line 61 (FIG. 4)

of characteristic impedance Z with the lumped element 62 of admittance $Y_1$, lumped element 63 of impedance Z2, and lumped element 64 of admittance $Y_1$. Such an equivalence 60 is described in issued U.S. Pat. No. 5,175,517, entitled "Lumped Element Realization of Ring Hybrids Including Circuit and Tank Circuit Means", herein incorporated by reference. Applying such an analysis here, the following results are obtained for a single quarter wavelength transmission line: $C=Y_1/\omega$ and $L=Z_2/\omega$ ($\omega$ is the operating angular frequency of interest), where two capacitors 65 and 67 of capacitance C are coupled in parallel to ground and one series inductor 66 of inductance L connects the two capacitors opposite the ground connection.

Implementing the results of the equivalence analysis produces FIG. 3. The FIG. 3 embodiment of lumped element impedance transforming combiner/divider 50 includes three ports 51, 52 and 53. The terminating impedance at port 51 is $R_1$ (first terminating impedance) and the terminating impedance at ports 52 and 53 is $R_2$ (second terminating impedance). Connected to port 51 are three lumped elements 54, 55, and 56. Element 54 is a capacitor of capacitance $C_o$, which is connected to ground. Elements 55 and 56 are inductors, with substantially equal value inductances of $L_2$. Elements 55 and 56 are connected to ports 52 and 53. Connected to ports 52, 53 and ground are capacitors 57 and 58, each of capacitance $C_1$. Ports 52 and 53 are connected via a resistor 59 of resistance $R_x$. The lumped elements 54, 55, and 56 dependency on the port terminations for FIG. 3 are in accordance with the following (where $\omega$ is the operating angular frequency of interest):

$$\omega C_o=(2/R_1R_2)^{0.5}$$

$$\omega C_1=1/(2R_1R_2)^{0.5}$$

$$\omega L_2=(2R_1R_2)^{0.5}$$

$$R_x=2R_2$$

In other words, in the impedance transforming three-port power divider/combiner using lumped elements in FIG. 3, there are first, second, and third lumped elements (54, 55, and 56, respectively) wherein the first lumped element 54 is a capacitor and the second and third lumped elements (55 and 56, respectively) are inductors of substantially equal inductances. The capacitive reactance for the first lumped element 54 equals a square root of one-half of a product of the first and second terminating impedances. Similarly, the inductive reactance for each of the second and third lumped elements equals the square root of twice the product of the first and second terminating impedances, and the capacitive reactance for each of the first and second capacitors equals the square root of twice the product of the first and second terminating impedances. Also, the resistance of the first resistor equals twice the second terminating impedance.

Figure 5:
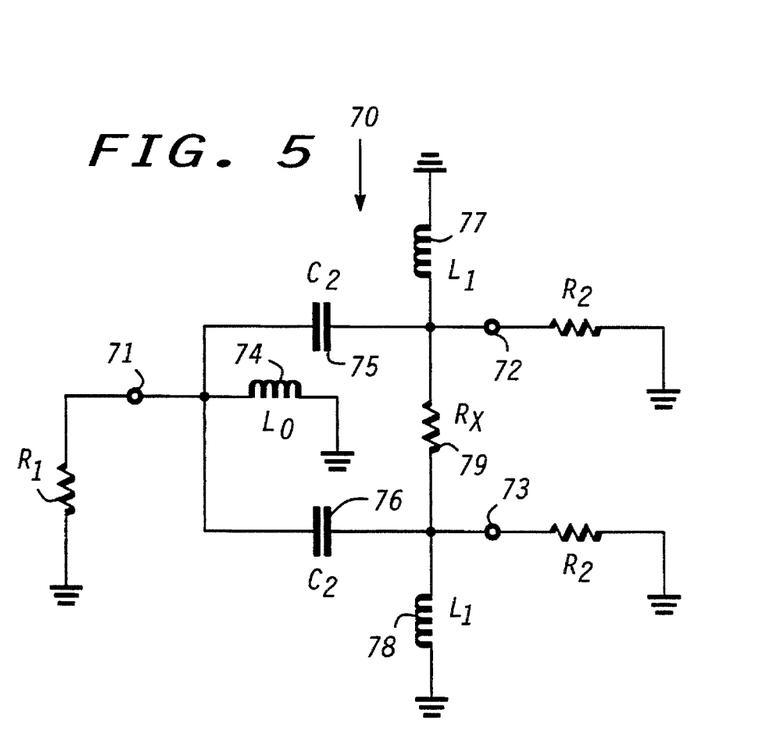
In FIG. 5, there is shown a second single section impedance transforming three-port power divider/combiner using lumped elements in accordance with a second preferred embodiment of the invention.

A second embodiment in accordance with the present invention, i.e. an impedance transforming three-port power divider/combiner 70 using lumped elements, is shown in FIG. 5. The FIG. 5 power divider/combiner includes three ports 71, 72 and 73. The terminating impedances at port 71 is $R_1$ (first terminating impedance) and ports 72 and 73 is $R_2$ (second terminating impedance). Connected to port 71 are three lumped elements 74, 75, and 76. Element 74 is an inductor of inductance $L_o$, which is connected to ground. Elements 75 and 76 are capacitors of equal capacitance $C_2$, and are connected to ports 72 and 73. Inductors 77 and 78, each of inductance $L_1$, are coupled between ports 72, 73 and ground. Ports 72 and 73 are connected via a resistor 79 of resistance $R_x$. The lumped elements 74, 75, and 76 dependency on the port terminations for FIG. 5 are in accordance with the following (where $\omega$ is the operating angular frequency of interest):

$$\omega L_1=(2R_1R_2)^{0.5}$$

$$\omega L_o=\omega L_1/2$$

$$\omega C_2=1/(2R_1R_2)^{0.5}$$

$$R_x=2R_2$$

In other words, in the impedance transforming three-port power divider/combiner using lumped elements in FIG. 5, there are first, second, and third lumped elements (74, 75, and 76, respectively) wherein the first lumped element 74 is an inductor and the second and third lumped elements (75 and 76, respectively) are capacitors of substantially equal capacitances. The inductive reactance for inductors 77 and 78 are substantially equal and are equal to the square root of twice the product of the first and second terminating impedances. The inductive reactance for the first lumped element 74 equals one-half of the inductive reactance for each of inductors 77 and 78. The capacitive reactance for each of the second and third lumped elements 75 and 76 equals the square root of twice the product of the first and second terminating impedances. The resistance of resistor 79 equals twice the second terminating impedance.

Figure 6:
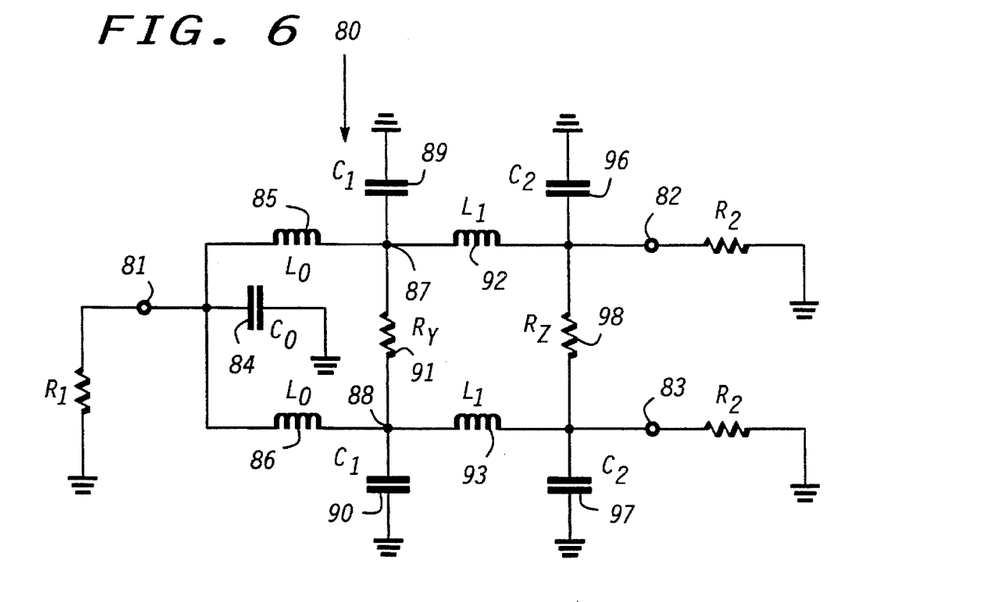
In FIG. 6, there is shown a third impedance transforming three-port power divider/combiner using lumped elements in accordance with a third embodiment of the invention; and In FIG. 7 there is shown a fourth impedance transforming three-port power divider/combiner using lumped elements in accordance with a fourth embodiment of the invention.

A third embodiment in accordance with the present invention, i.e. an impedance transforming three-port power divider/combiner 80 using lumped elements, is shown in FIG. 6. The FIG. 6 power divider/combiner has the capability of providing multi-octave frequency performance. The terminating impedances at port 81 is $R_1$ (first terminating impedance) and ports 82 and 83 is $R_2$ (second terminating impedance). Connected to port 81 are three lumped elements 84, 85, and 86. Element 84 is a capacitor of capacitance $C_o$, and is connected to ground. Elements 85 and 86 are inductors of equal inductance $L_o$, and are connected to nodes 87 and 88. Capacitors 89 and 90 of capacitance $C_1$ are connected to nodes 87, 88 and ground. Nodes 87 and 88 are connected with a resistor 91 of resistance $R_y$. Inductor 92 of inductance $L_1$ couples node 87 and port 82, and inductor 93 of inductance $L_1$ couples node 88 and port 83. Ports 82 and 83 are connected via a resistor 98 of resistance $R_z$. Capacitors 96 and 97, each of capacitance $C_2$, are connected to ports 82 and 83 and ground. The lumped elements 84, 85, and 86 dependency on the port terminations for FIG. 6 are in accordance with the following (where $\omega$ is the operating angular frequency of interest):

$$\omega C_o=2/Z_1$$

$$\omega L_o=Z_1$$

$$\omega C_1=1/Z_1+1/Z_2$$

$$\omega L_1=Z_2$$

$$\omega C_2=Y_2$$

and where $Z_1$ and $Z_2$ are terminating impedances of transmission lines deduced from analysis in accordance with U.S. Pat. No. 4,367,445 referred to above.

In other words, in the impedance transforming three-port power divider/combiner using lumped elements in FIG. 6, there are first, second, and third lumped elements (84, 85, and 86, respectively) wherein the first lumped element 84 is a capacitor and the second and third lumped elements (85 and 86, respectively) are inductors of substantially equal inductances. Capacitors 89 and 90 have a first substantially equal capacitance and capacitors 96 and 97 have a second substantially equal capacitance. Inductors 92 and 93 have substantially equal inductances. The capacitive reactance of the first lumped element 84 is one-half the inductive reactance of the second lumped element 85. The capacitive reactance of each of capacitors 89 and 90 is equal to the product of the inductive reactance of the second lumped element 85 and the inductive reactance of inductor 92 divided by the sum of the inductive reactance of the second lumped element 85 and the inductive reactance of inductor 92. Similarly, the inductive reactance for each of the second and third lumped elements 85 and 86 equals the square root of twice the product of the first and second terminating impedances, and the capacitive reactance for each of capacitors 89 and 90 equals the square root of twice the product of the first and second terminating impedances. Also, the resistance of resistor 91 equals twice the second terminating impedance.

Figure 7:
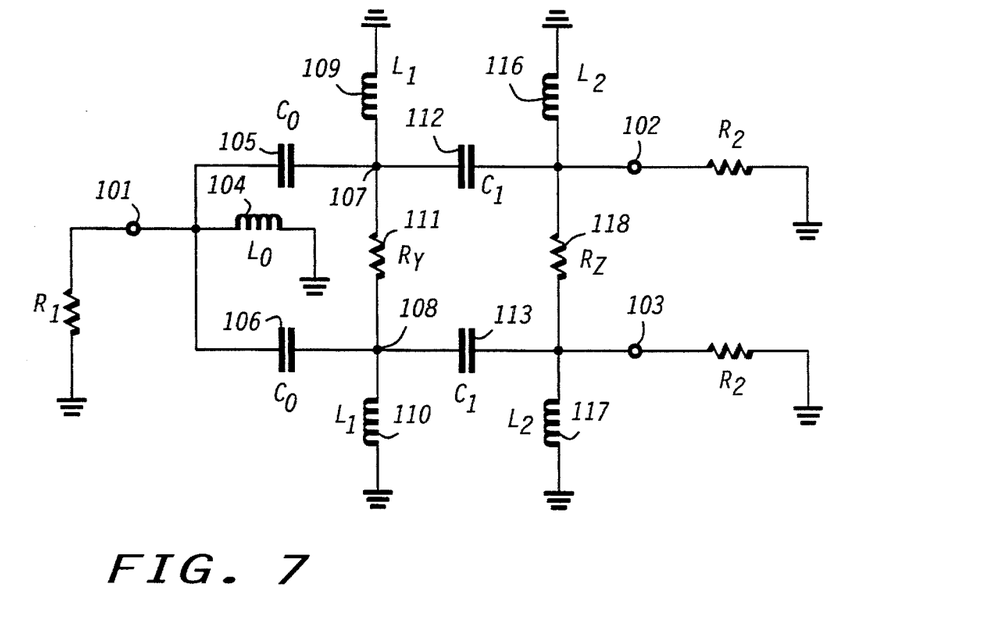

A fourth embodiment in accordance with the present invention, i.e. a impedance transforming three-port power divider/combiner 100 using lumped elements, is shown in FIG. 7. The FIG. 7 embodiment has the capability of providing multi-octave frequency performance. The terminating impedance at port 101 is $R_1$ (first terminating impedance) and at ports 102 and 103 is $R_2$ (second terminating impedance). Three lumped elements 104, 105, and 106 are connected to port 101. Element 104 is an inductor of inductance Lo and is connected to ground. Elements 105 and 106 are capacitors of equal capacitance $C_o$, and are connected to nodes 107 and 108. Inductors 109 and 110 of inductance $L_1$ are connected to nodes 107, 108 and ground. Nodes 107 and 108 are connected with a resistor 111 of resistance $R_y$. Capacitor 112 of capacitance $C_1$ connects node 107 and port 102, while capacitor 113 of capacitance $C_1$ connects node 108 and port 103. Ports 102 and 103 are connected via a resistor 118 of resistance $R_z$. Inductors 116 and 117, each of inductance $L_2$, are connected to ports 102 and 103 and ground. The lumped elements 104, 105, and 106 dependency on the port terminations for this embodiment are in accordance with the following:

$$\omega C_o = Y_1$$

$$\omega L_o = Z_1 Z_2 / (Z_1 + Z_2)$$

$$\omega C_1 = Y_2$$

$$\omega L_1 = Z_1$$

$$\omega L_2 = Z_2$$

$Z_1$ and $Z_2$ are terminating impedances of transmission lines deduced from analysis in accordance with U.S. Pat. No. 4,367,445 referred to above.

In other words, in the impedance transforming three-port power divider/combiner using lumped elements in FIG. 7, there are first, second, and third lumped elements (104, 105, and 106, respectively) wherein the first lumped element 104 is a capacitor and the second and third lumped elements (105 and 106, respectively) are capacitors of substantially equal capacitances. Inductors 109 and 110 have a first substantially equal inductance and Inductors 116 and 117 have a second substantially equal inductance. Capacitors 112 and 113 have substantially equal capacitances. The inductive reactance of the first lumped element 104 is a product of the inductive reactance of inductor 104 and the inductive reactance of inductor 116 divided by the sum of the inductive reactance of inductor 104 and the inductive reactance of inductor 116.

All of the embodiments described are operable as power dividers. Considering the circuit of FIG. 3 as a representative example, if an input signal to be divided is at port 51, identical divided output signals (in magnitude and phase) occur at ports 52 and 53. The terminating impedance $R_1$ at port 51 is not equal to the terminating impedance R2 at ports 52 and 53.

When the FIG. 3 embodiment is utilized as power combiner (again, as a representative example of the other embodiments), the input signals to be combined are at ports 52 and 53. The combined output signal appears at port 51. Note that for design purposes it is unnecessary to be concerned about whether a given port is used as an input or an output port. It is only important to know what the desired external impedance is at a given port and that the external port impedance for the pair of ports 52 and 53 are the same.

Thus, an impedance transforming three-port power divider/combiner using lumped elements has been described which overcomes specific problems and accomplishes certain advantages relative to prior art methods and mechanisms. The improvements over known technology are significant. The presented embodiments provide MMIC impedance transforming three port power combined divider using lumped elements. Utilization of these embodiments provides realization of MMIC power amplifiers, mixers, up converters and other devices using less gallium arsenide (GaAs) surface area. The result is reduced size, weight, improved performance greater cost effectiveness.

There has also been provided an impedance transforming three-port power divider/combiner using lumped elements that fully satisfies the aims and advantages set forth above. While the invention has been described in conjunction with a specific embodiment, many alternatives, modifications, and variations will be apparent to those of ordinary skill in the art in light of the foregoing description. Accordingly, the invention is intended to embrace all such alternatives, modifications, and variations as fall within the spirit and broad scope of the appended claims.

What is claimed is:

1. An impedance transforming three-port power divider/combiner comprising:

first, second, and third ports, wherein the first port has a first terminating impedance and the second and third ports each have a second terminating impedance different from the first terminating impedance;

first, second, and third lumped elements, wherein the first lumped element is a capacitor and the second and third lumped elements are inductors and the first lumped element is coupled between the first port and an electrical ground, the second lumped element is coupled between the first port and the second port, and the third lumped element is coupled between the first port and the third port;

a first resistor coupled between the second and third ports; and first and second capacitors, wherein the first capacitor is coupled between the second port and the electrical ground and the second capacitor is coupled between the third port and the electrical ground, such that a signal to be divided input to the first port results in identical divided output signals at the second and third ports and signals to be combined input to the second and third ports result in a combined output signal at the first port.

2. An impedance transforming three-port power divider/combiner as claimed in claim 1, wherein a capacitive reactance for the first lumped element equals a square root of one-half of a product of the first and second terminating impedances.

3. An impedance transforming three-port power divider/combiner as claimed in claim 1, wherein the second and third lumped elements have substantially equal inductances.

4. An impedance transforming three-port power divider/combiner as claimed in claim 3, wherein an inductive reactance for each of the second and third lumped elements equals a square root of twice a product of the first and second terminating impedances.

5. An impedance transforming three-port power divider/combiner as claimed in claim 1, wherein a capacitive reactance for each of the first and second capacitors equals a square root of twice a product of the first and second terminating impedances.

6. An impedance transforming three-port power divider/combiner as claimed in claim 1, wherein a resistance of the first resistor equals twice the second terminating impedance.

7. An impedance transforming three-port power divider/combiner using lumped elements comprising:

first, second, and third ports, wherein the first port has a first terminating impedance and the second and third ports each have a second terminating impedance different from the first terminating impedance;

first, second, and third lumped elements, wherein the first lumped element is coupled between the first port and an electrical ground, the second lumped element is coupled between the first port and the second port, and the third lumped element is coupled between the first port and the third port;

a first resistor coupled between the second and third ports; and first and second inductors, wherein the first inductor is coupled between the second port and the electrical ground and the second inductor is coupled between the third port and the electrical ground, such that a signal to be divided that is input to the first port results in identical divided output signals at the second and third ports and signals to be combined input to the second and the third ports result in a combined output signal at the first port.

8. An impedance transforming three-port power divider/combiner as claimed in claim 7, wherein the first lumped element is an inductor and the second and third lumped elements are capacitors.

9. An impedance transforming three-port power divider/combiner as claimed in claim 7, wherein the second and third lumped elements have substantially equal capacitances.

10. An impedance transforming three-port power divider/combiner as claimed in claim 9, wherein an inductive reactance for each of the first and second inductors comprises a square root of twice a product of the first and second terminating impedances.

11. An impedance transforming three-port power divider/combiner as claimed in claim 10, wherein an inductive reactance for the first lumped element equals one-half of the inductive reactance for each of the first and second inductors.

12. An impedance transforming three-port power divider/combiner as claimed in claim 9, wherein a capacitive reactance for each of the second and third lumped elements equals a square root of twice a product of the first and second terminating impedances.

13. An impedance transforming three-port power divider/combiner as claimed in claim 7 wherein a resistance of the first resistor equals twice the second terminating impedance.

14. An impedance transforming three-port power divider/combiner using lumped elements comprising:

first, second, and third ports, wherein the first port has a first terminating impedance and the second and third ports each have a second terminating impedance different from the first terminating impedance;

first, second, and third lumped elements, wherein the first lumped element is coupled between the first port and an electrical ground, the second lumped element is coupled between the first port and a first node, and the third lumped element is coupled between the first port and a second node;

a first resistor coupled between the first node and the second node;

first and second capacitors, wherein the first capacitor is coupled between the first node and the electrical ground and the second capacitor is coupled between the second node and the electrical ground;

first and second coupling inductors, wherein the first coupling inductor is coupled between the first node and the second port and the second coupling inductor is coupled between the second node and the third port;

third and fourth capacitors, wherein the third capacitor is coupled between the second port and the electrical ground and the fourth capacitor is coupled between the third port and the electrical ground; and a second resistor coupled between the second and the third ports such that a signal to be divided input to the first port results in identical divided output signals at the second and the third ports and signals to be combined input to the second and the third ports result in a combined output signal at the first port.

15. An impedance transforming three-port power divider/combiner using lumped elements as claimed in claim 14, wherein first lumped element is a capacitor and the second and the third lumped elements are inductors of substantially equal inductances.

16. An impedance transforming three-port power divider/combiner using lumped elements as claimed in claim 15, wherein the first and second capacitors have a first substantially equal capacitance and the third and fourth capacitors have a second substantially equal capacitance.

17. An impedance transforming three-port power divider/combiner using lumped elements as claimed in claim 16, wherein the first and the second coupling inductors have substantially equal inductances.

18. An impedance transforming three-port power divider/combiner using lumped elements as claimed in claim 16, wherein a capacitive reactance of the first lumped element is one-half an inductive reactance of the second lumped element.

19. An impedance transforming three-port power divider/combiner using lumped elements as claimed in claim 20, wherein a capacitive reactance of each of the first and the second capacitors is equal to a product of the inductive reactance of the second lumped element and an inductive reactance of the first coupling inductor divided by a sum of the inductive reactance of the second lumped element and the inductive reactance of the first coupling inductor.

20. An impedance transforming three-port power divider/combiner using lumped elements comprising:

first, second, and third ports, wherein the first port has a first terminating impedance and the second and third ports each have a second terminating impedance different from the first terminating impedance;

first, second, and third lumped elements, wherein the first lumped element is coupled between the first port and an electrical ground, the second lumped element is coupled between the first port and a first node, and the third lumped element is coupled between the first port and a second node;

a first resistor coupled between the first and the second nodes;

first and second inductors, wherein the first inductor is coupled between the first node and the electrical ground and the second inductor is coupled between the second node and the electrical ground;

first and second coupling capacitors, wherein the first coupling capacitor is coupled between the first node and the second port and the second coupling capacitor is coupled between the second node and the third port;

third and fourth inductors, wherein the third inductor is coupled between the second port and the electrical ground and the fourth inductor is coupled between the third port and the electrical ground; and a second resistor coupled between the second and the third ports such that a signal to be divided input to the first port results in identical divided output signals at the second and the third ports and signals to be combined input to the second and the third ports result in a combined output signal at the first port.

21. An impedance transforming three-port power divider/combiner using lumped elements as claimed in claim 20, wherein first lumped element is an inductor and the second and the third lumped elements are capacitors of substantially equal capacitances.

22. An impedance transforming three-port power divider/combiner using lumped elements as claimed in claim 21, wherein the first and second inductors have a first substantially equal inductance and the third and fourth inductors have a second substantially equal inductance.

23. An impedance transforming three-port power divider/combiner using lumped elements as claimed in claim 22, wherein the first and the second coupling capacitors have substantially equal capacitances.

24. An impedance transforming three-port power divider/combiner using lumped elements as claimed in claim 22, wherein an inductive reactance of the first lumped element is a product of an inductive reactance of the first inductor and an inductive reactance of the third inductor divided by a sum of the inductive reactance of the first inductor and the inductive reactance of the third inductor.

* * * * *

UNITED STATES PATENT AND TRADEMARK OFFICE
CERTIFICATE OF CORRECTION

PATENT NO. : 5,469,129
DATED : November 21, 1995
INVENTOR(S) : Michael Dydyk

It is certified that error appears in the above-indentified patent and that said Letters Patent is hereby corrected as shown below:

Column 8, claim 19, line 52, the numeral "20" should be --18--.

Signed and Sealed this

Twenty-third Day of April, 1996

Attest:

BRUCE LEHMAN

Attesting Officer     *Commissioner of Patents and Trademarks*